(12) United States Patent
Isaka et al.

(10) Patent No.: US 8,043,935 B2
(45) Date of Patent: Oct. 25, 2011

(54) METHOD FOR MANUFACTURING SEMICONDUCTOR SUBSTRATE AND METHOD FOR MANUFACTURING SEMICONDUCTOR DEVICE

(75) Inventors: Fumito Isaka, Zama (JP); Sho Kato, Ebina (JP); Yu Arita, Atsugi (JP); Akihisa Shimomura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/621,541

(22) Filed: Nov. 19, 2009

(65) Prior Publication Data
US 2010/0129948 A1    May 27, 2010

(30) Foreign Application Priority Data
Nov. 27, 2008    (JP) .................. 2008-302169

(51) Int. Cl.
*H01L 21/30* (2006.01)
(52) U.S. Cl. . 438/455; 438/402; 438/406; 257/E21.122; 257/E21.567
(58) Field of Classification Search .................. 438/143, 438/310, 402, 409
See application file for complete search history.

(56) References Cited

U.S. PATENT DOCUMENTS

| | | | |
|---|---|---|---|
| 5,374,564 A | 12/1994 | Bruel | |
| 5,869,387 A | 2/1999 | Sato et al. | |
| 6,121,117 A | 9/2000 | Sato et al. | |
| 6,251,754 B1 | 6/2001 | Ohshima et al. | |
| 6,335,231 B1 | 1/2002 | Yamazaki et al. | |
| 6,534,380 B1 | 3/2003 | Yamauchi et al. | |
| RE39,484 E | 2/2007 | Bruel | |
| 7,781,308 B2 | 8/2010 | Isaka et al. | |
| 7,790,563 B2 | 9/2010 | Kakehata | |
| 2003/0159644 A1* | 8/2003 | Yonehara et al. | .................. 117/8 |
| 2007/0063306 A1* | 3/2007 | Doyle et al. | .................. 257/486 |
| 2009/0042362 A1 | 2/2009 | Moriwaka | |
| 2009/0142904 A1 | 6/2009 | Isaka et al. | |

(Continued)

FOREIGN PATENT DOCUMENTS
EP    0 553 852    8/1993
(Continued)

OTHER PUBLICATIONS

Dross et al., "Stress-Induced Lift-Off Method for Kerf-Loss-Free Wafering of Ultra-Thin(~50 μm) Crystalline Si Wafers," Proceeding of 33$^{rd}$ IEEE PVSC, 2008.

(Continued)

*Primary Examiner* — Cheung Lee
(74) *Attorney, Agent, or Firm* — Eric J. Robinson; Robinson Intellectual Property Law Office, P.C.

(57) ABSTRACT

An object is to manufacture a semiconductor substrate having a single crystal semiconductor layer with favorable characteristics, without requiring CMP treatment and/or heat treatment at high temperature. In addition, another object is to improve productivity of semiconductor substrates. Vapor-phase epitaxial growth is performed by using a first single crystal semiconductor layer provided over a first substrate as a seed layer, whereby a second single crystal semiconductor layer is formed over the first single crystal semiconductor layer, and separation is performed at an interface of the both layers. Thus, the second single crystal semiconductor layer is transferred to the second substrate to provide a semiconductor substrate, and the semiconductor substrate is reused by performing laser light treatment on the seed layer.

11 Claims, 8 Drawing Sheets

U.S. PATENT DOCUMENTS

2009/0197392 A1* 8/2009 Isaka et al. .................... 438/458
2010/0081254 A1 4/2010 Shimomura et al.

FOREIGN PATENT DOCUMENTS

| | | |
|---|---|---|
| EP | 1 043 768 | 10/2000 |
| EP | 1 251 556 | 10/2002 |
| JP | 05-211128 | 8/1993 |
| JP | 05-217821 | 8/1993 |
| JP | 09-260619 | 10/1997 |
| JP | 10-093122 | 4/1998 |
| JP | 10-321548 | 12/1998 |
| JP | 11-097379 | 4/1999 |
| JP | 2000-030993 | 1/2000 |
| JP | 2003-017671 | 1/2003 |

OTHER PUBLICATIONS

Office Action (U.S. Appl. No. 12/564,973) dated Mar. 21, 2011.

* cited by examiner

METHOD FOR MANUFACTURING SEMICONDUCTOR SUBSTRATE AND METHOD FOR MANUFACTURING SEMICONDUCTOR DEVICE

BACKGROUND OF THE INVENTION

1. Field of the Invention

The present invention relates to a method for manufacturing a single crystal semiconductor layer. In addition, the present invention relates to a method for manufacturing a semiconductor substrate including a single crystal semiconductor film and a method for reprocessing a semiconductor substrate.

2. Description of the Related Art

Integrated circuits using an SOI substrate where a thin single crystal semiconductor layer is formed on an insulating surface, instead of a bulk silicon wafer, have been developed. The use of an SOI substrate can reduce parasitic capacitance between a drain of a transistor and a substrate; thus, SOI substrates are attracting attention for their ability to improve performance of semiconductor integrated circuits.

A Smart Cut method is known as one of methods for manufacturing an SOI substrate (e.g., see Patent Document 1). An outline method for manufacturing an SOI substrate by a Smart Cut method is described below. Hydrogen ions are implanted into a silicon wafer to form a microbubble layer at a predetermined depth from the surface. The silicon wafer into which hydrogen ions have been implanted is bonded to another silicon wafer with a silicon oxide film interposed therebetween. After that, by performing heat treatment, the microbubble layer is to be a cleavage plane, and the wafer into which the hydrogen ions are implanted is peeled in a thin film state. A Smart Cut method is also called a "hydrogen ion implantation separation method".

In Patent Document 1, in order to improve the planarity of the surface of the single crystal silicon layer and repair a defect in the single crystal silicon layer, CMP treatment and/or heat treatment at high temperature (about 1200° C. or lower) is performed after the single crystal silicon layer is formed.

Further, a method for reusing the silicon wafer after a single crystal silicon layer is peeled off and transferred from a silicon wafer by a Smart Cut method is known (e.g., see Patent Document 2). In Patent Document 2, after the single crystal silicon layer is peeled off from the silicon wafer, the silicon wafer is planarized by CMP treatment or the like.

[References]
[Patent Documents]
[Patent Document 1] Japanese Published Patent Application No. 2003-017671
[Patent Document 2] Japanese Published Patent Application No. H11-097379

SUMMARY OF THE INVENTION

In the case where a single crystal semiconductor layer is formed by such a method as disclosed in Patent Document 1, CMP treatment and/or heat treatment at high temperature is needed; therefore, it is difficult to provide an inexpensive large-sized semiconductor substrate (SOI substrate). As an example of a practical option for realizing a large-sized semiconductor substrate (SOI substrate), a glass substrate should be used as a substrate to which a single crystal semiconductor layer is attached. However, a glass substrate does not satisfy the above requirement in terms of its heat resistance. In addition, CMP treatment is surface-polishing treatment, which has high difficulty in performing uniform treatment on a large area.

In view of the above problems, an object is to manufacture a single crystal semiconductor layer with favorable characteristics, without performing CMP treatment and/or heat treatment at high temperature. Another object is to provide a semiconductor substrate (or an SOI substrate) including such a single crystal semiconductor layer.

Further, in the case where a silicon wafer is reused by such a method as disclosed in Patent Document 2, the silicon wafer is polished by CMP treatment in every peeling/transferring step; therefore, the thickness of the silicon wafer is reduced gradually, so that the silicon wafer cannot be reprocessed.

In view of the above problems, another object is to increase the number of times of reprocessing a semiconductor substrate to improve the productivity.

A manufacturing method disclosed in this specification is a method in which vapor-phase epitaxial growth is performed by using a first single crystal semiconductor layer as a seed layer, whereby a second single crystal semiconductor layer is formed over the first single crystal semiconductor layer, and separation is performed at an interface of the both layers. At this time, the both layers are separated from each other using high compressive stress of the second single crystal semiconductor layer to the first single crystal semiconductor layer.

In addition, the first single crystal semiconductor layer after the above separation is subjected to vapor-phase epitaxial growth again and reused as a seed layer. In this case, the first single crystal semiconductor layer is preferably subjected to a laser process.

A method for manufacturing a semiconductor substrate disclosed in this specification includes the following steps: a step of providing a first single crystal semiconductor layer over a first substrate; a step of providing a second single crystal semiconductor layer over the first single crystal semiconductor layer by a vapor-phase epitaxial growth method; a step of attaching the first substrate and a second substrate to each other with an insulating layer interposed therebetween so that the first single crystal semiconductor layer and the second single crystal semiconductor layer are provided between the first substrate and the second substrate; a step of separating the first substrate and the second substrate from each other at an interface between the first single crystal semiconductor layer and the second single crystal semiconductor layer so that the first single crystal semiconductor layer is provided over the first substrate, and so that the second single crystal semiconductor layer is provided over the second substrate; and a step of irradiating the first single crystal semiconductor layer with laser light.

A method for manufacturing a semiconductor substrate disclosed in this specification includes the following steps: a step of attaching a first substrate and a single crystal semiconductor substrate in which an embrittlement layer is formed at a predetermined depth, to each other with an insulating layer interposed therebetween; a step of separating the single crystal semiconductor substrate and the first substrate from the embrittlement layer so that a first single crystal semiconductor layer is provided over the first substrate; a step of providing a second single crystal semiconductor layer over the first single crystal semiconductor layer by a vapor-phase epitaxial growth method; a step of attaching the first substrate and a second substrate to each other with an insulating layer interposed therebetween so that the first single crystal semiconductor layer and the second single crystal semiconductor layer are provided between the first substrate and the second substrate; a step of separating the first substrate and the second substrate from each other at an interface between the first single crystal semiconductor layer and the second single crystal semiconductor layer so that the first single crystal semiconductor layer is provided over the first substrate and so that the second single crystal semiconductor layer is provided over the second substrate; and a step of irradiating the first single crystal semiconductor layer with laser light.

A method for manufacturing a semiconductor device disclosed in this specification includes the following steps: a step of providing a single crystal semiconductor layer over a first substrate; a step of providing a photoelectric conversion layer over the single crystal semiconductor layer by a vapor-phase epitaxial growth method; a step of providing a first conductive layer over the photoelectric conversion layer; a step of attaching the first substrate and a second substrate to each other with an insulating layer interposed therebetween so that the single crystal semiconductor layer, the photoelectric conversion layer, and the first conductive layer are provided between the first substrate and the second substrate; a step of separating the first substrate and the second substrate from each other at an interface between the single crystal semiconductor layer and the photoelectric conversion layer so that the single crystal semiconductor layer is provided over the first substrate and so that the first conductive layer and the photoelectric conversion layer are provided over the second substrate; and a step of providing a second conductive layer over the photoelectric conversion layer.

A method for manufacturing a semiconductor device disclosed in this specification includes the following steps: a step of providing a first single crystal semiconductor layer over a first substrate; a step of providing a photoelectric conversion layer by forming a second single crystal semiconductor layer having one conductivity type, a third single crystal semiconductor layer which is intrinsic, and a fourth single crystal semiconductor layer having an opposite conductivity type to the one conductivity type in this order over the first single crystal semiconductor layer by a vapor-phase epitaxial method; a step of providing a first conductive layer over the photoelectric conversion layer; a step of attaching the first substrate and a second substrate to each other with an insulating film interposed therebetween so that the first single crystal semiconductor layer, the photoelectric conversion layer, and the first conductive layer are provided between the first substrate and the second substrate; a step of separating the first substrate and the second substrate from each other at an interface between the first single crystal semiconductor layer and the second single crystal semiconductor layer so that the first single crystal semiconductor layer is provided over the first substrate, and so that the first conductive layer and the photoelectric conversion layer are provided over the second substrate; and a step of providing a second conductive layer over the photoelectric conversion layer.

Note that in the case where a single crystal silicon layer is formed as the second single crystal semiconductor layer, vapor-phase epitaxial growth is preferably performed in which in the source gas, a flow rate of hydrogen is greater than or equal to 4 times and less than or equal to 10 times (preferably greater than or equal to 5 times and less than or equal to 7 times) that of a silane based gas.

In addition, a glass substrate is preferably used as each of the first substrate and the second substrate.

A "single crystal" in this specification means a crystal in which, when a certain crystal axis is focused, the direction of the crystal axis is oriented in the same direction in any portion of a sample and which has no crystal grain boundaries between crystals. Note that in this specification, the single crystal includes a crystal in which the direction of crystal axes is uniform as described above and which has no grain boundaries even when it includes a crystal defect or a dangling bond.

A "semiconductor substrate" in this specification includes a substrate in which a bulk silicon wafer is provided with a thin single crystal semiconductor layer or a substrate in which an insulating substrate is provided with a thin single crystal semiconductor layer.

A "semiconductor device" in this specification means all devices which are capable of functioning by utilizing semiconductor characteristics, and electro-optical devices, semiconductor circuits, and electronic devices are all included in the category of semiconductor devices.

A "photoelectric conversion device" in this specification means all devices which convert light energy to electrical energy and convert electrical energy to light energy, for example, a solar cell and the like.

A "display device" in this specification includes a light-emitting device and a liquid crystal display device. The light-emitting device includes a light-emitting element, and the liquid crystal display device includes a liquid crystal element. The light emitting element includes, in its scope, an element whose luminance is controlled by a current or a voltage, and specifically includes an inorganic electroluminescent (EL) element, an organic EL element, and the like.

The second single crystal semiconductor layer is separated from the first single crystal semiconductor layer utilizing compressive stress of the second single crystal semiconductor layer formed by a vapor-phase epitaxial growth method. Thus, a defect or the like does not occur in the second single crystal semiconductor layer itself, whereby heat treatment at high temperature is not needed. In addition, the second single crystal semiconductor layer after being separated has high planarity; therefore, planarization treatment such as CMP treatment is not needed. Accordingly, it becomes easy to realize a large-sized semiconductor substrate (SOI substrate).

Further, a method for separating the first single crystal semiconductor layer and the second single crystal semiconductor layer which is formed by a vapor-phase epitaxial growth method from each other is used. Thus, the first single crystal semiconductor layer is used repeatedly as a seed layer, whereby the efficiency of a reprocessing treatment is increased and the productivity of semiconductor substrates (SOI substrates) can be improved.

DETAILED DESCRIPTION OF THE INVENTION

Figure 1A:
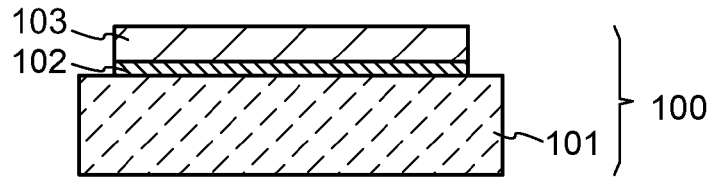
FIGS. 1A to 1E illustrate an example of a method for manufacturing a semiconductor substrate.

Embodiments of the invention disclosed in this specification will be described with reference to accompanying drawings. Note that the invention disclosed in this specification will be readily appreciated by those skilled in the art that various changes and modifications are possible without departing from the spirit and the scope of the present invention. Therefore, the invention disclosed in this specification should not be interpreted as being limited to the description of the embodiments. Note that in all the drawings for describing the embodiments, the same portions or portions having the same functions are denoted by the same reference numerals, and the description thereof will be made only once.

Embodiment 1

In this embodiment, an example of a method for manufacturing a semiconductor substrate (also called an SOI substrate) is described with reference to drawings.

First, a first SOI substrate 100 (also called a seed substrate) is prepared (see FIG. 1A).

In the first SOI substrate 100, a first single crystal semiconductor layer 103 (also called a seed layer) can be provided over a first substrate 101 with an insulating layer 102 interposed therebetween.

An example of a method for manufacturing the first SOI substrate 100 is shown in FIG. 8. The first substrate 101 and a single crystal semiconductor substrate 801 such as a silicon wafer are prepared (see FIGS. 8A and 8B). An embrittlement layer 803 is formed in such a manner that a surface of the single crystal semiconductor substrate 801 is irradiated with an ion beam 802 which is formed of ions accelerated in the electric field, and the ions are introduced to a region of a predetermined depth (see FIG. 8C). Next the single crystal semiconductor substrate 801 is attached to the first substrate 101 with the insulating layer 102 interposed therebetween (see FIGS. 8D and 8E). Then, heat treatment is performed to cause separation at the embrittlement layer 803, whereby the first single crystal semiconductor layer 103 is formed over the first substrate 101 (see FIG. 8F). In order to increase the planarity of the first single crystal semiconductor layer 103, laser light irradiation treatment is also effective. In this manner, the first SOI substrate 100 is manufactured.

Here, as the first substrate 101, a substrate made of an insulator can be used.

Specifically, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be given. Note that when the above glass substrate contains a large amount of boric acid ($B_2O_3$), the heat resistance of glass is improved; when it contains a larger amount of barium oxide (BaO) than boric acid, more-practical heat-resistant glass can be obtained. Therefore, it is preferable that a glass substrate containing more BaO than $B_2O_3$ be used. Besides, as the first substrate 101, a single crystal semiconductor substrate (for example, a single crystal silicon substrate or the like) may be used. In this embodiment, the case of using a glass substrate as the first substrate 101 is described. When a glass substrate which can have a large area and is inexpensive is used as the first substrate 101, the cost can be reduced.

In addition, it is preferable that the surface of the above first substrate 101 be cleaned in advance. Specifically, ultrasonic cleaning is performed on the first substrate 101 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. Through such cleaning treatment, the surface planarity of the first substrate 101 can be improved and abrasive particles left on the surface of the first substrate 101 can be removed.

As the insulating layer 102, a single layer of a silicon oxide film, a silicon oxynitride film, a silicon nitride film, a silicon nitride oxide film, or the like, or a stacked layer thereof can be used. Note that a silicon oxynitride film refers to a film that contains more oxygen than nitrogen and contains oxygen, nitrogen, silicon, and hydrogen at concentrations ranging from 55 to 65 at. %, 1 to 20 at. %, 25 to 35 at. %, and 0.1 to 10 at. %, respectively. Further, a silicon nitride oxide film means a film that contains more nitrogen than oxygen and contains oxygen, nitrogen, silicon, and hydrogen at concentrations ranging from 15 to 30 at. %, 20 to 35 at. %, 25 to 35 at. %, and 15 to 25 at. %, respectively.

Note that the single crystal semiconductor substrate 801 which is separated from the first SOI substrate is subjected to CMP treatment and/or heat treatment at high temperature and is used repeatedly, whereby a plurality of the first SOI substrates 100 can be manufactured. This reprocessing treatment of the single crystal semiconductor substrate is called a first reprocessing treatment process.

Figure 1B:
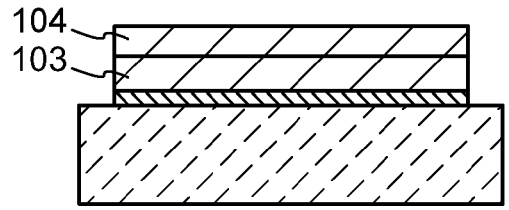

Next, a second single crystal semiconductor layer 104 is formed over the first single crystal semiconductor layer 103 by a vapor-phase epitaxial growth method (see FIG. 1B).

The second single crystal semiconductor layer 104 may be formed using a material similar to that of the first single crystal semiconductor layer 103. For example, in the case where a single crystal silicon layer is formed, a vapor-phase growth method (including a CVD method or the like) can be employed, in which a mixed gas of a silane-based gas (a gas containing a hydrogen compound of silicon, typically monosilane or disilane) and hydrogen is used as a source gas.

In the source gas used in the above vapor-phase epitaxial growth, a flow rate ratio of hydrogen to a silane-based gas is preferably set to be greater than or equal to 4 times and less than or equal to 10 times, more preferably, greater than or equal to 5 times and less than or equal to 7 times. In other words, the dilution ratio of hydrogen to the silane-based gas (hydrogen/silane-based gas) is set at a ratio of greater than or equal to 4 times and less than or equal to 10 times, preferably greater than or equal to 5 times and less than or equal to 7 times. The silane-based gas is typified by silane; alternatively, disilane ($Si_2H_6$) or the like can be used. Further, a rare gas may be added to the source gas.

As a plasma CVD apparatus used for the epitaxial growth, a high-frequency (RF) plasma CVD apparatus with an electric power frequency of greater than or equal to 10 MHz and less than or equal to 200 MHz, typically of 13.56 MHz or 60 MHz, or a microwave plasma CVD apparatus with an electric power frequency of greater than or equal to 1 GHz and less than or equal to 5 GHz, typically of 2.45 GHz, or the like can be used.

A condition for the epitaxial growth can be determined as appropriate. As an example of the condition, a mixed gas of silane and hydrogen may be used as a source gas, and the flow rate (sccm) of silane and hydrogen may be $SiH_4:H_2$ is 25 (sccm):150 (sccm); the temperature of the substrate 280° C.; the output electric power of the high-frequency power source 30 W; and the electric power frequency 27 MHz. The second single crystal semiconductor layer 104 which is formed under the above conditions (especially with the above flow rate ratio) has high compressive stress and easy to be separated at an interface with the first single crystal semiconductor layer 103. Note that in the case where the temperature of the substrate at the time of film deposition is about 200° C. to 300° C., the second single crystal semiconductor layer 104 can be obtained to be favorable and with a small number of defects.

In addition, time taken for the film deposition can be reduced and the crystallinity thereof can be improved by increasing the total flow rate of the source gas.

The thickness of the second single crystal semiconductor layer 104 may be set to be a needed thickness. However, as the thickness of the second single crystal semiconductor layer 104 is increased, it becomes easier to perform separation at an interface between the first single crystal semiconductor layer 103 and the second single crystal semiconductor layer 104 because the compressive stress tends to be increased. For example, the second single crystal semiconductor layer 104 may be formed to have a thickness of about 100 nm to 10 μm.

Note that before forming the second single crystal semiconductor layer 104 by the epitaxial growth, it is preferable to remove a native oxide film or the like formed over the surface of the first single crystal semiconductor layer 103. This is because when an oxide film or the like exists on the surface of the first single crystal semiconductor layer 103, the epitaxial growth does not proceed and there is a possibility that the crystallinity of the second single crystal semiconductor layer 104 is decreased. Such an oxide film can be removed using a solution containing fluorinated acid. Specifically, treatment may be performed using fluorinated acid (or dilute hydrofluoric acid) until the surface of the first single crystal semiconductor layer 103 exhibits a water repellent property. Note that it is preferable that the surface of the first single crystal semiconductor layer 103 be cleaned using a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like in terms of removing contamination.

Figure 1C:
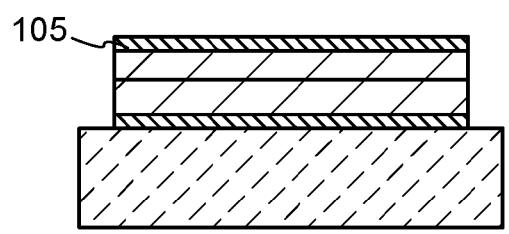

Next, an insulating layer 105 is formed over the second single crystal semiconductor layer 104 (see FIG. 1C).

The insulating layer 105 can be formed to have a single layer or stacked layers of an insulating layer such as a silicon oxide film, a silicon oxynitride film, a silicon nitride film, a silicon nitride oxide film, or the like. These films can be formed by a thermal oxidation method, a CVD method, a sputtering method, or the like.

In this specification, silicon oxynitride refers to the one that contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Further, silicon nitride oxide refers to the one that contains more nitrogen than oxygen and for example, silicon nitride oxide includes oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 30 atomic %, respectively. Note that the above-described ranges are the ranges when silicon oxynitride and silicon nitride oxide are measured using Rutherford backscattering spectrometry (RBS) or hydrogen forward scattering spectrometry (HFS). In addition, the total for the content ratio of the constituent elements does not exceed 100 atomic %.

Figure 1D:
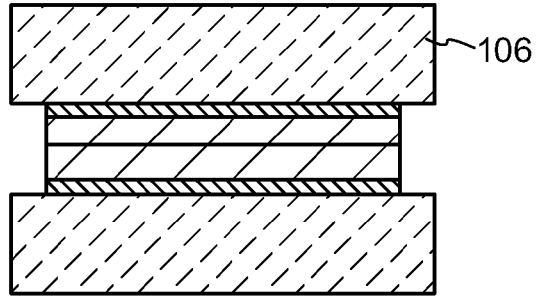

After that, the first substrate 101 and a second substrate 106 are attached to each other with the insulating layer 105 interposed therebetween (see FIG. 1D). The insulating layer 105 functions as a bonding layer which bonds the second single crystal semiconductor layer 104 and the second substrate 106 to each other.

As the second substrate 106, a substrate similar to the first substrate 101 may be used. In this embodiment, the case of using a glass substrate as the second substrate 106 is described. When a glass substrate which can have a large area and is inexpensive is used as the second substrate 106, the cost can be reduced. A surface of the second substrate 106 is preferably cleaned using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF) similarly to the first substrate 101.

Note that surface treatment may be performed on the insulating layer 105 before attaching the first substrate 101 and the second substrate 106 to each other. As the surface treatment, plasma treatment, ozone treatment, megasonic cleaning, or two-fluid cleaning (a method for spraying functional water such as pure water or hydrogen-containing water with a carrier gas such as nitrogen), or a combination thereof is performed, whereby dust such as an organic substance on the surface of the insulating layer 105 can be removed and the surface of the insulating layer 105 can be made hydrophilic. As a result, the bonding strength between the first substrate 101 and the second substrate 106 can be improved. Especially, it is effective to perform ozone treatment, megasonic cleaning, two-fluid cleaning, or the like on the surface of insulating layer 105 after plasma treatment is performed on the surface of the insulating layer 105.

Alternatively, a nitrogen-containing layer (e.g., an insulating film which contains nitrogen such as a silicon nitride film or a silicon nitride oxide film) may be formed over the second substrate 106 before attaching the first substrate 101 and the second substrate 106 to each other. The nitrogen-containing layer functions as a barrier layer for preventing an element contained in the second substrate, such as sodium, from diffusing into the second single crystal semiconductor layer 104. Plasma treatment, ozone treatment, megasonic cleaning, two-fluid cleaning, or the like is performed on a surface of the nitrogen-containing layer in a manner similar to the insulating layer 105, whereby the bonding strength between the first substrate 101 and the second substrate 106 can be improved.

Alternatively, heat treatment may be performed in order to increase the bonding strength after attaching the first substrate and the second substrate to each other. A condition for the heat treatment can be determined as appropriate; however, it needs to be noted that when heat treatment is performed at high temperature (for example, higher than or equal to 600° C.), adhesion between the first single crystal semiconductor layer 103 and the second single crystal semiconductor layer 104 is increased and separation at an interface becomes difficult in some cases. The above heat treatment can be performed using a heating furnace such as a resistance heating furnace and a diffusion furnace, a rapid thermal annealing (RTA) apparatus, a microwave heating apparatus, or the like.

Figure 1E:
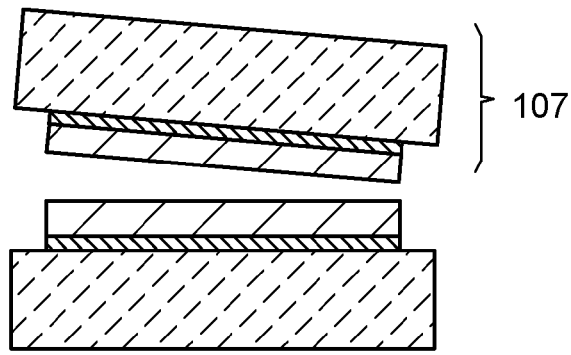

Next, the first substrate 101 and the second substrate 106 are separated from each other at the interface between the first single crystal semiconductor layer 103 and the second single crystal semiconductor layer 104, whereby the first single crystal semiconductor layer 103 is provided over the first substrate 101 and the second single crystal semiconductor layer 104 is provided over the second substrate 106 (see FIG. 1E). In this case, the compressive stress of the second single crystal semiconductor layer 104 to the first single crystal semiconductor layer 103 is high, whereby separation can be easily performed.

As the above separation method, a dynamic method (a method for peeling easily) by a substrate separation apparatus or the like can be employed. Further, for example, a method in which treatment of promoting separation is performed at the interface between the first single crystal semiconductor layer 103 and the second single crystal semiconductor layer 104, such as water-jetting, may be employed.

Furthermore, treatment for thinning the second single crystal semiconductor layer 104 or treatment for further improving the planarity may be performed. As the above-described treatment, one of dry etching and wet etching, or etching in which dry etching and wet etching are combined can be employed.

Through the above steps, the semiconductor substrate (a second SOI substrate 107) can be manufactured.

In this embodiment, the second single crystal semiconductor layer 104 is separated from the first SOI substrate 100 by utilizing the stress of the second single crystal semiconductor layer 104 formed by a vapor-phase epitaxial growth method. Thus, a defect or the like does not occur in the second single crystal semiconductor layer 104 itself, whereby heat treatment at high temperature is not needed. In addition, the second single crystal semiconductor layer 104 after being separated has high planarity; therefore, planarization treatment such as CMP treatment is not needed either. Accordingly, by employing the manufacturing method in this embodiment, a semiconductor substrate (the second SOI substrate 107) with favorable characteristics and a large area can be provided.

Then, using the obtained semiconductor substrate (the second SOI substrate 107), a semiconductor device such as a thin film transistor with favorable characteristics and a large area can be manufactured. In the case where a thin film transistor is manufactured, an island-like semiconductor layer may be formed using the second single crystal semiconductor layer 104, and a gate insulating film and a gate electrode may be formed. An interlayer insulating film, an electrode, and the like are formed and their shapes are adjusted as elements. In the case where an n-type thin film transistor or a p-type thin film transistor is manufactured, an element imparting conductivity may be added to the island-like semiconductor layer.

In this embodiment, a method in which separation is performed at the interface between the first single crystal semiconductor layer 103 and the second single crystal semiconductor layer 104 which is formed by a vapor-phase epitaxial growth method is employed. Thus, the first single crystal semiconductor layer 103 can be used repeatedly as a seed layer because the thickness of the first single crystal semiconductor layer 103 is not reduced. That is, the second SOI substrate 107 can be manufactured using the first SOI substrate 100 repeatedly as a seed substrate, whereby the productivity of semiconductor substrates can be significantly improved. This reprocessing treatment of the first SOI substrate 100 is called a second reprocessing treatment process.

When the second reprocessing treatment process is performed, the first single crystal semiconductor layer 103 may be subjected to laser light irradiation treatment. By the laser light irradiation, a defect in the first single crystal semiconductor layer 103 can be reduced and the surface planarity can be increased. Laser light irradiation treatment can shorten process time compared with CMP treatment and/or heat treatment at high temperature, and yield can be improved.

When deterioration of the first single crystal semiconductor layer 103 (seed layer) by performing the second reprocessing treatment process repeatedly using the first SOI substrate 100 as the seed substrate is concerned, deterioration of the seed layer can be prevented by using the second SOI substrate 107 as the seed substrate and performing epitaxial growth by using the second single crystal semiconductor layer 104 as the seed layer.

Further, by employing both of the second reprocessing treatment and the above-described first reprocessing treatment, the productivity can be improved synergistically and the number of obtained semiconductor substrates can be increased drastically.

The structure described in this embodiment can be used in combination with any of the structures described in the other embodiments or example of this specification, as appropriate.

Embodiment 2

In this embodiment, an example of a method for manufacturing a single crystal semiconductor layer is described with reference to drawings.

Figure 2A:
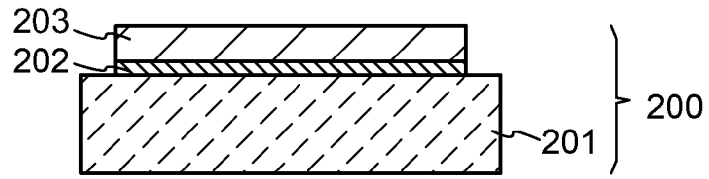
FIGS. 2A to 2E illustrate an example of a method for manufacturing a single crystal semiconductor layer.

First, an SOI substrate 200 (also called a seed substrate) is prepared (see FIG. 2A).

The SOI substrate 200 may be manufactured in a manner similar to the first SOI substrate 100 described in Embodiment 1, and may have a structure where a first single crystal semiconductor layer 203 (also called a seed layer) is provided over a substrate 201 with an insulating layer 202 interposed therebetween.

That is, part of a single crystal semiconductor substrate is transferred to the substrate 201, whereby a first single crystal semiconductor layer 203 can be formed. The single crystal semiconductor substrate used here can be used repeatedly by performing the first reprocessing treatment process in a manner similar to Embodiment 1.

Figure 2B:
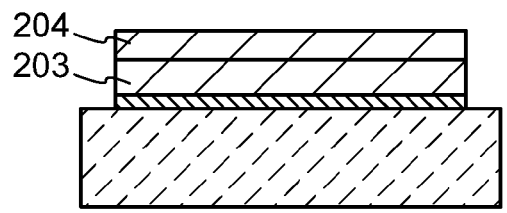

Next, a second single crystal semiconductor layer 204 is formed over the first single crystal semiconductor layer 203 using a vapor-phase epitaxial growth method in a manner similar to Embodiment 1 (see FIG. 2B).

Figure 2C:
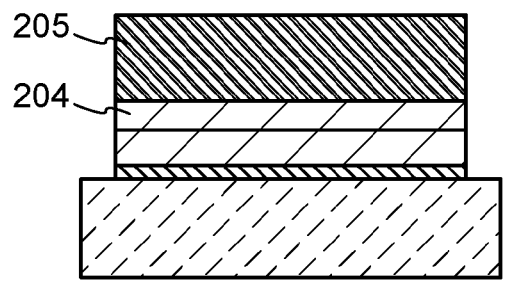

Then, the SOI substrate 200 and the second single crystal semiconductor layer 204 are heated, and while a predetermined temperature is kept, a material containing a metal is applied (or screen-printed) to the second single crystal semiconductor layer 204. Thus, a metal layer 205 is formed (see FIG. 2C). There is no particular limitation on the heating temperature as long as the heating temperature is a temperature at which the metal layer 205 can be formed. The metal layer 205 can be formed using a material such as aluminum or copper. Note that the metal layer 205 may be formed by a sputtering method or the like.

Figure 2D:
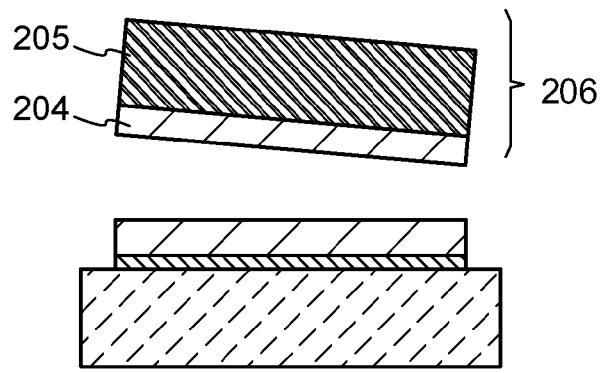

After that, the SOI substrate 200 and the second single crystal semiconductor layer 204 are separated from each other at an interface between the first single crystal semiconductor layer 203 and the second single crystal semiconductor layer 204 by cooling the SOI substrate 200, the second single crystal semiconductor layer 204, and the metal layer 205, whereby a stacked-layer structure body 206 of the metal layer 205 and the second single crystal semiconductor layer 204 is formed (see FIG. 2D). There is no particular limitation on the cooling temperature; for example, the temperature can be set at about room temperature. Needless to say, the cooling temperature may be lower than room temperature.

The second single crystal semiconductor layer 204 can be separated from the SOI substrate 200 by the above method because the single crystal semiconductor material and the metal material have largely different thermal expansion coefficients. By this principle, the greater the difference between the temperature when the metal layer 205 is formed and the temperature after the cooling is, the more preferably separation can be realized.

Figure 2E:

After that, by removing the metal layer 205, the second single crystal semiconductor layer 204 (self-supported film) can be formed (see FIG. 2E).

Although the structure where the metal layer 205 is finally removed is employed in this embodiment, this embodiment is not limited thereto. For example, in the case where the metal layer 205 is used for an electrode or the like, a structure where the metal layer 205 is not removed may be employed.

Alternatively, the second single crystal semiconductor layer 204 which is formed may be used as is, or the second single crystal semiconductor layer 204 attached to a substrate may be used.

Note that, in the above-described separation, a dynamic method (a method for peeling easily) by a substrate separation apparatus or the like, a method for promoting separation such as water-jetting, or the like may be employed in combination.

The second single crystal semiconductor layer 204 which is obtained may be subjected to laser light irradiation treatment. Thus, a defect in the second single crystal semiconductor layer 204 is reduced and the second single crystal semiconductor layer 204 whose surface planarity is improved can be obtained. Alternatively, the second single crystal semiconductor layer 204 may be subjected to heat treatment so that the defect may be reduced.

Further, treatment for thinning the second single crystal semiconductor layer 204 or treatment for further improving the planarity may be performed. As the above-described treatment, one of dry etching and wet etching, or etching in which dry etching and wet etching are combined can be employed.

In this embodiment, the second single crystal semiconductor layer 204 is separated from the SOI substrate 200 by utilizing the stress of the second single crystal semiconductor layer 204 formed by a vapor-phase epitaxial growth method. Thus, a defect or the like hardly occurs in the second single crystal semiconductor layer 204 itself, whereby heat treatment at high temperature is not needed. In addition, the second single crystal semiconductor layer 204 after being separated has high planarity; therefore, planarization treatment such as CMP treatment is not needed either. Accordingly, by employing the manufacturing method in this embodiment, a single crystal semiconductor layer with favorable characteristics and a large area can be provided.

On the other hand, the SOI substrate 200 can be used repeatedly as the seed substrate by performing the second reprocessing treatment process, in a manner similar to Embodiment 1, whereby the productivity of single crystal semiconductor layers can be improved.

Further, by employing both of the second reprocessing treatment and the above-described first reprocessing treatment, the productivity can be improved synergistically and the number of obtained single crystal semiconductor layers can be increased drastically.

The structure described in this embodiment can be used in combination with any of the structures described in the other embodiments or example of this specification, as appropriate.

Embodiment 3

In this embodiment, a method for manufacturing a photoelectric conversion device as an example of a method for manufacturing a semiconductor device is described with reference to drawings.

Figure 3A:
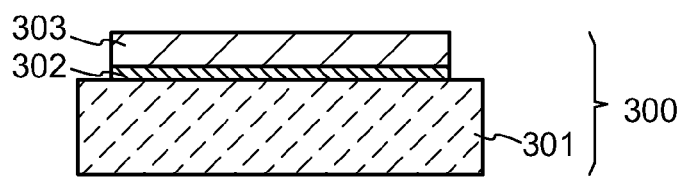
FIGS. 3A to 3E illustrate an example of a method for manufacturing a semiconductor device.

First, an SOI substrate 300 (also called a seed substrate) is prepared (see FIG. 3A).

The SOI substrate 300 may be manufactured in a manner similar to the first SOI substrate 100 described in Embodiment 1, and may have a structure where a first single crystal semiconductor layer 303 (also called a seed layer) is provided over a first substrate 301 with an insulating layer 302 interposed therebetween.

That is, part of a single crystal semiconductor substrate is transferred to the first substrate 301, whereby the first single crystal semiconductor layer 303 can be formed. The single crystal semiconductor substrate used here can be used repeatedly by performing the first reprocessing treatment process in a manner similar to Embodiment 1.

Figure 3B:
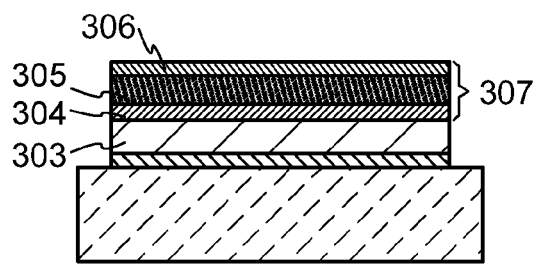

Next, a second single crystal semiconductor layer 304 is formed over the first single crystal semiconductor layer 303 (see FIG. 3B). The second single crystal semiconductor layer 304 is, for example, formed using a vapor-phase epitaxial growth method.

The second single crystal semiconductor layer 304 is a semiconductor layer which is influenced by the crystallinity of the first single crystal semiconductor layer 303 used as the seed layer.

When a silicon layer is formed as the second single crystal semiconductor layer 304, a vapor-phase growth method (including a CVD method or the like) can be employed, in which a mixed gas of a silane-based gas (a gas containing a hydrogen compound of silicon, typically monosilane or disilane) and hydrogen and a gas containing an element imparting p-type conductivity (e.g., diborane) is used as a source gas. Thus, the second single crystal semiconductor layer 304 can be a p-type silicon layer and can be a p-type semiconductor layer of the photoelectric conversion device.

A flow rate ratio of hydrogen to a silane-based gas is preferably set to be greater than or equal to 4 times and less than or equal to 10 times, more preferably, greater than or equal to 5 times and less than or equal to 7 times for the epitaxial growth. In other words, the dilution ratio of hydrogen to the silane-based gas (hydrogen/silane based gas) is set to be greater than or equal to 4 times and less than or equal to 10 times, preferably greater than or equal to 5 times and less than or equal to 7 times. The silane-based gas is typified by silane; alternatively, disilane ($Si_2H_6$) or the like can be used. Further, a rare gas may be added to the source gas.

As a plasma CVD apparatus used for the epitaxial growth, a high-frequency (RF) plasma CVD apparatus with an electric power frequency of greater than or equal to 10 MHz and less than or equal to 200 MHz, typically of 13.56 MHz or 60 MHz, or a microwave plasma CVD apparatus with an electric power frequency of greater than or equal to 1 GHz and less than or equal to 5 GHz, typically of 2.45 GHz, or the like can be used.

A condition for the epitaxial growth can be determined as appropriate. As an example of the condition, a mixed gas of silane and hydrogen may be used as a source gas, and the flow rate (sccm) of silane and hydrogen may be $SiH_4$:$H_2$ is 25 (sccm):150 (sccm); the temperature of the substrate 280° C.; the output of the high-frequency power source 30 W; and the electric power frequency 27 MHz. The second single crystal semiconductor layer 304 which is formed under the above conditions (especially with the above flow rate ratio) has high compressive stress and separation can be easily performed at an interface with the first single crystal semiconductor layer 303. Note that in the case where the temperature of the substrate at the time of film deposition is about 200° C. to 300° C., the second single crystal semiconductor layer 304 can be obtained to be favorable and with a small number of defects. In addition, time taken for the film deposition can be reduced and the crystallinity thereof can be improved by increasing the total flow rate of the source gas.

The second single crystal semiconductor layer 304 may be formed to have a thickness of about 1 nm to 100 nm (preferably, about 10 nm to 80 nm).

Note that before forming the second single crystal semiconductor layer 304 by the epitaxial growth, it is preferably to remove a native oxide film or the like formed over the surface of the first single crystal semiconductor layer 303. This is because when an oxide film or the like exists on the surface of the first single crystal semiconductor layer 303, there is a possibility that the epitaxial growth does not proceed and the crystallinity of the second single crystal semiconductor layer 304 is decreased. Such an oxide film can be removed using a solution containing fluorinated acid.

Next, a third single crystal semiconductor layer 305 is formed over the second single crystal semiconductor layer 304 (see FIG. 3B). The third single crystal semiconductor layer 305 is formed, for example, by a vapor-phase epitaxial growth method.

When a silicon layer is formed as the third single crystal semiconductor layer 305, a vapor-phase growth method (including a CVD method or the like) can be employed, in which a mixed gas of a silane-based gas (a gas containing a hydrogen compound of silicon, typically monosilane or disilane) and hydrogen is used as a source gas. Thus, the third single crystal semiconductor layer 305 can be an intrinsic silicon layer and can be an intrinsic semiconductor layer of the photoelectric conversion device.

The third single crystal semiconductor layer 305 may be formed to have a thickness of about 0.1 μm or more (preferably, about 1 μm or more).

Note that the intrinsic semiconductor layer mentioned here refers to a semiconductor layer in which a concentration of an impurity therein imparting p-type or n-type is $1 \times 10^{20}$ cm$^{-3}$ or lower, a concentration of oxygen and nitrogen are each $9 \times 10^{19}$ cm$^{-3}$ or lower, and of which a photoconductivity is 1000 times a dark conductivity or more. Further, in this specification, an intrinsic semiconductor layer is also called an i-type semiconductor layer.

Note that before forming the third single crystal semiconductor layer 305 by the epitaxial growth, it is preferable to remove a native oxide film or the like formed over the surface of the second single crystal semiconductor layer 304.

Next, a fourth single crystal semiconductor layer 306 is formed over the third single crystal semiconductor layer 305 (see FIG. 3B). The fourth single crystal semiconductor layer 306 is formed, for example, by a vapor-phase epitaxial growth method.

When a silicon layer is formed as the fourth single crystal semiconductor layer 306, a vapor-phase growth method (including a CVD method or the like) can be employed, in which a mixed gas of a silane-based gas (a gas containing a hydrogen compound of silicon, typically monosilane or disilane) and hydrogen, and a gas containing an element imparting an n-type conductivity are used as a source gas. Thus, the fourth single crystal semiconductor layer 306 can become an n-type silicon layer and can be an n-type semiconductor layer of the photoelectric conversion device.

The fourth single crystal semiconductor layer 306 may be formed to have a thickness of about 1 nm to 100 nm (preferably, about 10 nm to 80 nm).

Note that before forming the fourth single crystal semiconductor layer 306 by the epitaxial growth, it is preferable to remove a native oxide film or the like formed over the surface of the third single crystal semiconductor layer 305.

Through the above steps, a photoelectric conversion layer 307 of the photoelectric conversion device (a p-type semiconductor layer, an i-type semiconductor layer, and an n-type semiconductor layer) can be formed.

Although the second single crystal semiconductor layer 304 is a p-type semiconductor layer and the fourth single crystal semiconductor layer 306 is an n-type semiconductor layer in this embodiment, the present invention is not limited to this. The second single crystal semiconductor layer 304 may be an n-type semiconductor layer and the fourth single crystal semiconductor layer 306 may be a p-type semiconductor layer. The second single crystal semiconductor layer 304 and the fourth single crystal semiconductor layer 306 are set so that the second single crystal semiconductor layer 304 and the fourth single crystal semiconductor layer 306 have opposite conductivity types to each other.

Figure 3C:
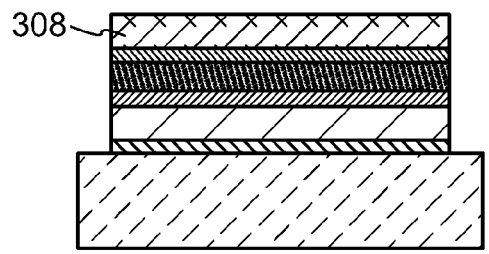

Next, a first conductive layer 308 to be a first electrode of the photoelectric conversion device is formed over the fourth single crystal semiconductor layer 306 (see FIG. 3C).

The first conductive layer 308 can be formed using an element selected from aluminum, silver, titanium, tantalum, tungsten, molybdenum, or copper, or an alloy material or compound material mainly containing any of these elements. Alternatively, a stack including any of these materials may be used. In this embodiment, aluminum with low resistance and low cost is used, and a structure is employed in which titanium nitride is provided on a top surface and a bottom surface of an aluminum layer. Titanium nitride is provided between the fourth single crystal semiconductor layer 306 and the aluminum layer, whereby aluminum can be prevented from being diffusing into the fourth single crystal semiconductor layer 306.

Figure 3D:
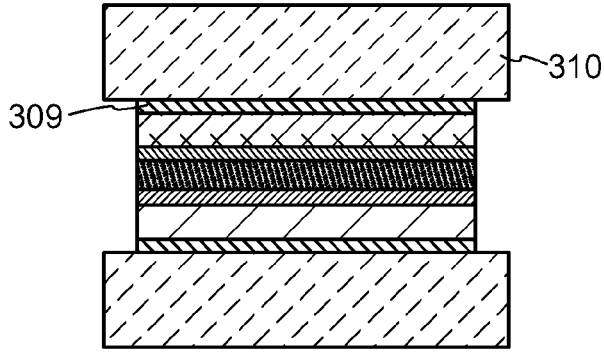

Next, an insulating layer 309 is formed over the first conductive layer 308 (see FIG. 3D).

The insulating layer 309 can be formed using silicon oxide, silicon nitride, silicon oxynitride, aluminum oxide, or the like by a thermal oxidation method, a CVD method, a sputtering method, or the like. In this embodiment, the insulating layer 309 is formed using aluminum oxide. Thus, the first conductive layer 308 and the insulating layer 309 can be successively formed by a sputtering method.

After that, the first substrate 301 and the second substrate 310 are attached to each other with the insulating layer 309 interposed therebetween (see FIG. 3D). The insulating layer 309 functions as a bonding layer which bonds the photoelectric conversion layer 307 and the second substrate 310 to each other.

Since titanium nitride is provided between the insulating layer 309 and the aluminum layer, even in the case where oxygen is contained in the insulating layer 309 such as aluminum oxide, oxidation of aluminum can be prevented.

Note that it is preferable that surface treatment be performed on the insulating layer 309 before the first substrate 301 and the second substrate 310 are bonded to each other. As the surface treatment, plasma treatment, ozone treatment, megasonic cleaning, two-fluid cleaning (a method of spraying functional water such as pure water or hydrogen-containing water with a carrier gas such as nitrogen), or combination thereof can be employed, whereby dust such as an organic substance on a surface of the insulating layer 309 can be removed and the surface of the insulating layer 309 can be made hydrophilic. As a result, the bonding strength between the first substrate 301 and the second substrate 310 can be increased. Especially, it is effective that after plasma treatment is performed on the surface of the insulating layer 309, ozone treatment, megasonic cleaning, two-fluid cleaning, or the like is performed.

Alternatively, a nitrogen-containing layer (e.g., an insulating film which contains nitrogen such as a silicon nitride film or a silicon nitride oxide film) (not shown) may be formed over the second substrate 310 before attaching the first substrate 301 and the second substrate 310 to each other. The nitrogen-containing layer functions as a barrier layer for preventing an element contained in the second substrate 310, such as sodium, from diffusing into the second single crystal semiconductor layer 304. Plasma treatment, ozone treatment, megasonic cleaning, two-fluid cleaning, or the like is performed on a surface of the nitrogen-containing layer in a manner similar to the insulating layer 309, whereby the bonding strength between the first substrate 301 and the second substrate 310 can be improved.

Alternatively, after attaching the first substrate 301 and the second substrate 310 to each other, heat treatment may be performed in order to increase the bonding strength. A condition for the heat treatment can be determined as appropriate; however, it needs to be noted that when heat treatment is performed at high temperature (e.g., higher than or equal to 600° C.), adhesion between the first single crystal semiconductor layer 303 and the second single crystal semiconductor layer 304 is increased and separation at the interface becomes difficult in some cases. The above heat treatment can be performed using a heating furnace such as a resistance heating furnace and a diffusion furnace, a rapid thermal annealing (RTA) apparatus, a microwave heating apparatus, or the like.

Figure 3E:
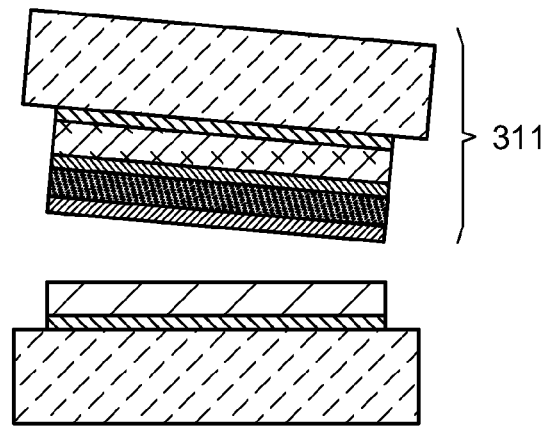

Next, the first substrate 301 and the second substrate 310 are separated from each other at an interface between the first single crystal semiconductor layer 303 and the second single crystal semiconductor layer 304, whereby the first single crystal semiconductor layer 303 is provided over the first substrate 301 and the photoelectric conversion layer 307 is provided over the second substrate 310 (see FIG. 3E). In this case, the compressive stress of the second single crystal semiconductor layer 304 to the first single crystal semiconductor layer 303 is high, whereby separation can be easily performed.

In addition, the SOI substrate 300, the photoelectric conversion layer 307, and the first conductive layer 308 may be cooled by the method described in Embodiment 2. The first conductive layer 308 can obtain an effect similar to that of the metal layer 205 in Embodiment 2 and separation is promoted.

As the above separation method, a dynamic method (a method for peeling easily) by a substrate separation apparatus or the like can be employed. Further, a method in which treatment of promoting separation is performed at the interface between the first single crystal semiconductor layer 303 and the second single crystal semiconductor layer 304, such as water-jetting, may be employed.

Through the above steps, a stacked-layer structure body 311 in which the first conductive layer 308 and the photoelectric conversion layer 307 are provided over the second substrate 310 can be obtained.

Figure 4A:
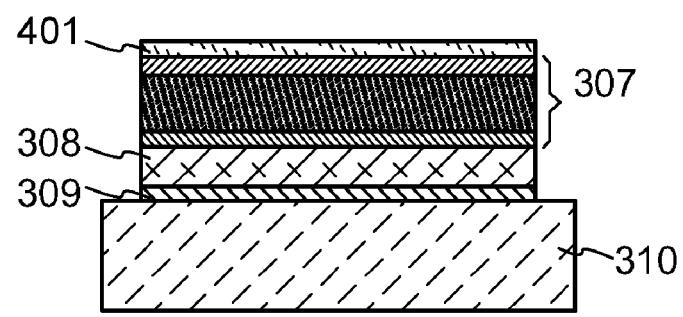
FIGS. 4A and 4B illustrate an example of a method for manufacturing a semiconductor device.

Next, a second conductive layer 401 is formed as a second electrode of the photoelectric conversion device over the second single crystal semiconductor layer 304 (see FIG. 4A). The second conductive layer 401 functions as a light-receiving surface electrode layer of the photoelectric conversion device.

The second conductive layer 401 can be formed using a light-transmitting conductive film. A metal oxide film such as an indium tin oxide (ITO) alloy film, an indium oxide-zinc oxide alloy film, a zinc oxide film, or a tin oxide film may be used. The second conductive layer 401 can be formed by a sputtering method or a vacuum evaporation method.

Figure 4B:
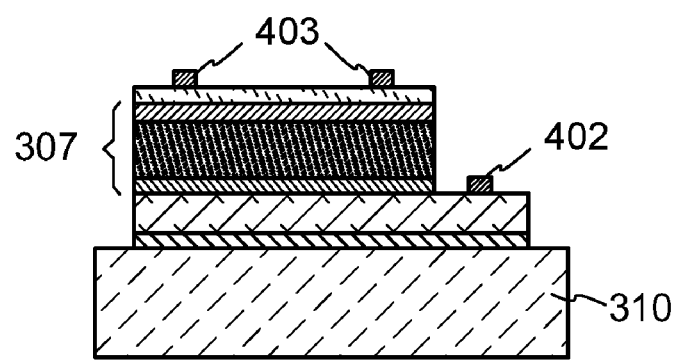

Next, the second conductive layer 401 and the photoelectric conversion layer 307 are etched to expose part of the first conductive layer 308 (see FIG. 4B).

The etching can be performed by laser light irradiation treatment. By using laser light, there is no need to additionally provide a mask. Alternatively, the second conductive layer 401 may be selectively formed and may be etched using the second conductive layer 401 as a mask. In this case, there is also no need to additionally provide a mask. It is needless to say that a mask may be formed using a resist or an insulating layer and the etching may be performed.

After that, a third conductive layer 402 and a fourth conductive layer 403 are formed as a first auxiliary electrode and a second auxiliary electrode, respectively. The first auxiliary electrode is electrically connected to the first conductive layer 308 and the second auxiliary electrode is electrically connected to the second conductive layer 401 (see FIG. 4B).

The third conductive layer 402 and the fourth conductive layer 403 can be formed by screen printing with silver ink. The fourth conductive layer 403 (on an upper electrode side) is formed so as to have a grid shape (or a comb-like shape or a pectinate shape). Accordingly, the photoelectric conversion layer 307 can be irradiated with enough light and light absorption efficiency can be improved.

Through the above steps, the photoelectric conversion device can be manufactured.

In this embodiment, the photoelectric conversion layer 307 is separated from the SOI substrate 300 by utilizing the stress of the second single crystal semiconductor layer 304 formed by a vapor-phase epitaxial growth method. Thus, a defect or the like does not occur in the photoelectric conversion device 307 itself, whereby heat treatment at high temperature is not needed. In addition, the second single crystal semiconductor layer 304 after being separated has high planarity; therefore, planarization treatment such as CMP treatment is not needed. Accordingly, by employing the manufacturing method in this embodiment, a photoelectric conversion device having a single crystal semiconductor layer with favorable characteristics and a large area can be provided.

On the other hand, the SOI substrate 300 can be used repeatedly as a seed substrate by performing the second reprocessing treatment process, in a manner similar to Embodiment 1, whereby the productivity of photoelectric conversion devices can be significantly improved.

Further, by utilizing both of the second reprocessing treatment and the above-described first reprocessing treatment, the productivity can be improved synergistically and the number of obtained semiconductor substrates can be increased drastically.

The structure described in this embodiment can be used in combination with any of the structures described in the other embodiments or example of this specification, as appropriate.

Embodiment 4

In this embodiment, an electronic device using the semiconductor device manufactured according to any of the above-described embodiments, particularly using a display device will be described with reference to FIGS. 5A to 5H and FIGS. 6A to 6C.

As electronic devices manufactured using a semiconductor device (particularly a display device), the following can be given: cameras such as a video camera and a digital camera, goggle-type displays (head-mounted displays), navigation systems, audio reproducing devices (such as car audio components), computers, game machines, portable information terminals (such as a mobile computer, a mobile phone, a portable game machine, and an e-book reader), and image reproducing devices provided with a recording medium (specifically, a device provided with a display device that can reproduce a recording medium such as a digital versatile disc (DVD) and display the image), and the like.

Figure 5A:
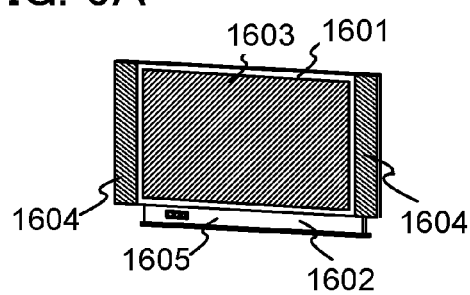
FIGS. 5A to 5H illustrate electronic devices using semiconductor devices.

FIG. 5A illustrates a television set or a monitor of a personal computer. The television set or the monitor of a personal computer includes a housing 1601, a support stand 1602, a display portion 1603, speaker portions 1604, a video input terminal 1605, and the like. The semiconductor device disclosed in this specification is used in the display portion 1603. By the semiconductor device disclosed in this specification, a television set or a monitor of a personal computer with high reliability and high performance can be provided at low price.

Figure 5B:
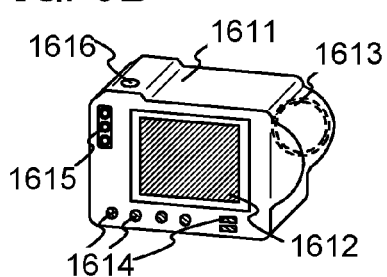

FIG. 5B illustrates a digital camera. An image receiving portion 1613 is provided in the front side of a main body 1611, and a shutter button 1616 is provided at the upper portion of the main body 1611. A display portion 1612, operation keys 1614, and an external connection port 1615 are provided at the back side of the main body 1611. The semiconductor device disclosed in this specification is used in the display portion 1612. By the semiconductor device disclosed in this specification, a digital camera with high reliability and high performance can be provided at low price.

Figure 5C:
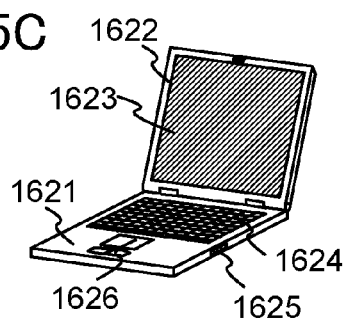

FIG. 5C illustrates a laptop personal computer. A main body 1621 is provided with a keyboard 1624, an external connection port 1625, and a pointing device 1626. A housing 1622 including a display portion 1623 is attached to the main body 1621. The semiconductor device disclosed in this specification is used in the display portion 1623. By the semiconductor device disclosed in this specification, a laptop personal computer with high reliability and high performance can be provided at low price.

Figure 5D:
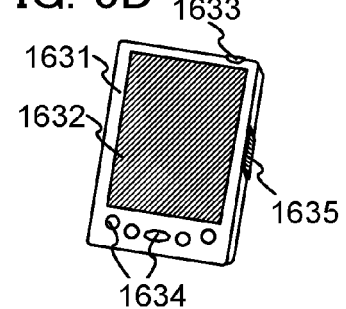

FIG. 5D illustrates a mobile computer, which includes a main body 1631, a display portion 1632, a switch 1633, operation keys 1634, an infrared port 1635, and the like. An active matrix display device is provided in the display portion 1632. The semiconductor device disclosed in this specification is used in the display portion 1632. By the semiconductor device disclosed in this specification, a mobile computer with high reliability and high performance can be provided at low price.

Figure 5E:
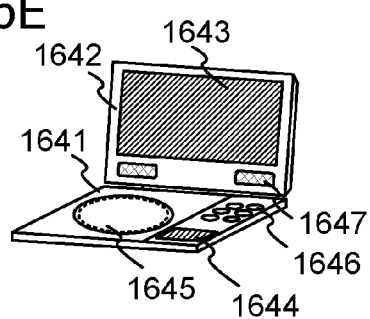

FIG. 5E illustrates an image reproducing device. A main body 1641 is provided with a display portion 1644, a recording medium reading portion 1645, and operation keys 1646. Further, a housing 1642 that includes speaker portions 1647 and a display portion 1643 is attached to the main body 1641. The semiconductor device disclosed in this specification is used in each of the display portions 1643 and 1644. By the semiconductor device disclosed in this specification, an image reproducing device with high reliability and high performance can be provided at low price.

Figure 5F:
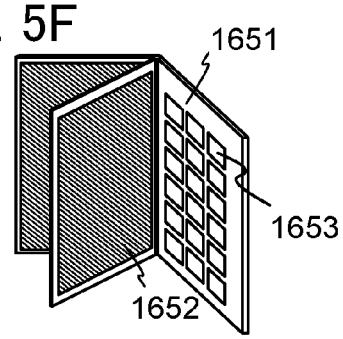

FIG. 5F illustrates an electronic book. A main body 1651 is provided with operation keys 1653. A plurality of display portions 1652 is attached to the main body 1651. The semiconductor device disclosed in this specification is used in the display portion 1652. By the semiconductor device disclosed in this specification, an electronic book with high reliability and high performance can be provided at low price.

Figure 5G:
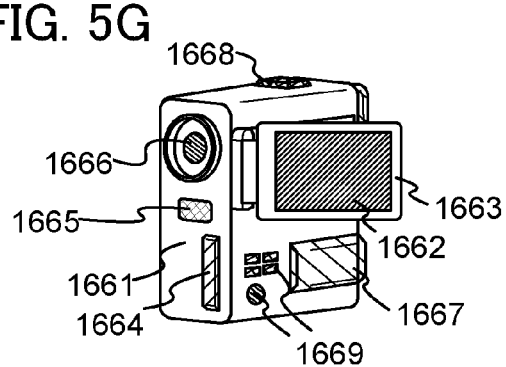

FIG. 5G illustrates a video camera. A main body 1661 is provided with an external connection port 1664, a remote control receiving portion 1665, an image receiving portion 1666, a battery 1667, an audio input portion 1668, and operation keys 1669. A housing 1663 including a display portion 1662 is attached to the main body 1661. The semiconductor device disclosed in this specification is used in the display portion 1662. By the semiconductor device disclosed in this specification, a video camera with high reliability and high performance can be provided at low price.

Figure 5H:
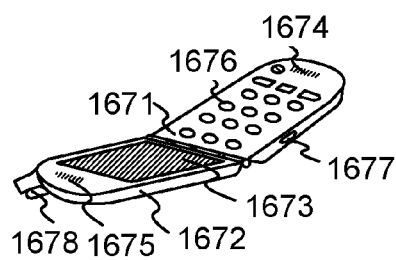

FIG. 5H illustrates a mobile phone, which includes a main body 1671, a housing 1672, a display portion 1673, an audio input portion 1674, an audio output portion 1675, operation keys 1676, an external connection port 1677, an antenna 1678, and the like. The semiconductor device disclosed in this specification is used in the display portion 1673. By the semiconductor device disclosed in this specification, a mobile phone with high reliability and high performance can be provided at low price.

Figure 6A:
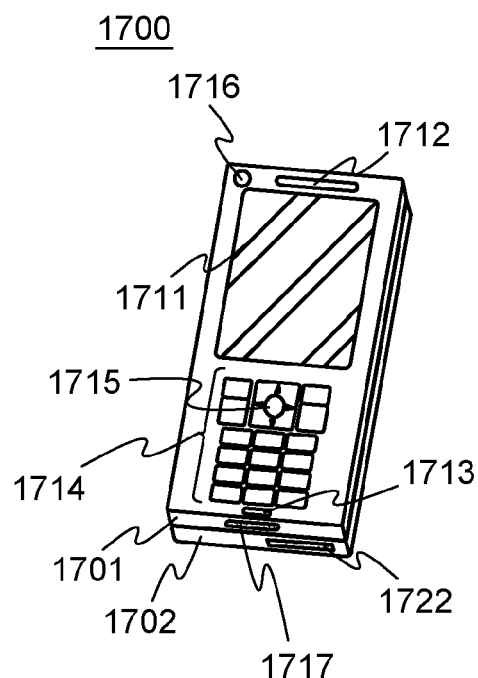
FIGS. 6A to 6C illustrate electronic devices using semiconductor devices.
Figure 6B:
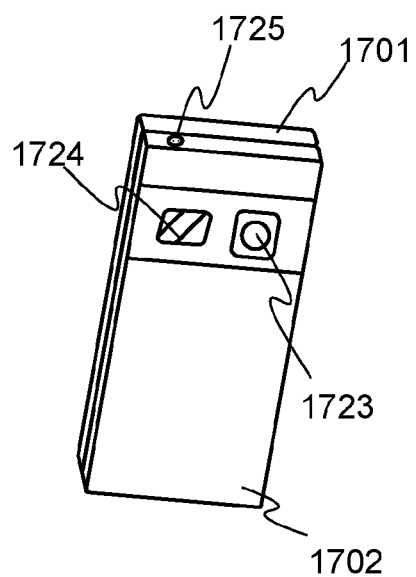
Figure 6C:
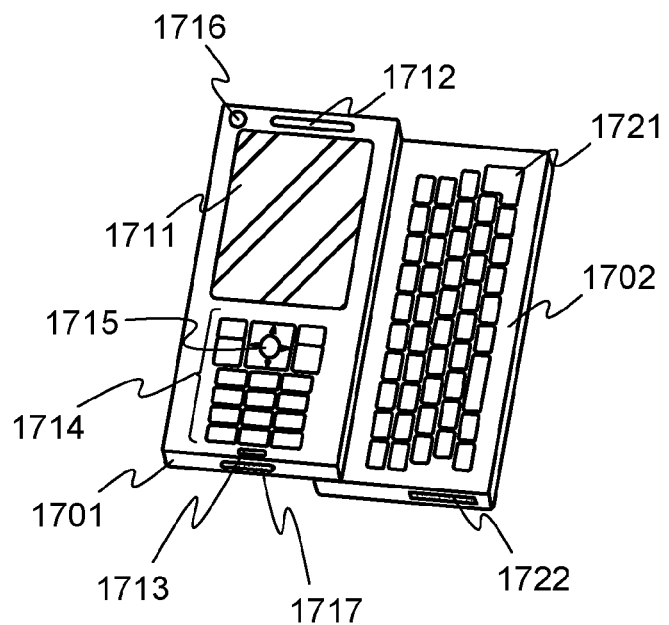

FIGS. 6A to 6C illustrate a structural example of a portable electronic device 1700 having functions as a telephone and an information terminal. FIG. 6A is a front view, FIG. 6B is a back view, and FIG. 6C is a developed view. The portable electronic device 1700 has functions as both a telephone and an information terminal and is an electronic device so-called a smartphone which is capable of a variety of data processing in addition to voice call.

The portable electronic device 1700 includes housings 1701 and 1702. The housing 1701 is provided with a display portion 1711, a speaker 1712, a microphone 1713, operation keys 1714, a pointing device 1715, a camera lens 1716, an external connection terminal 1717, and the like. The housing 1702 is provided with a keyboard 1721, an external memory slot 1722, a camera lens 1723, a light 1724, an earphone terminal 1725, and the like. In addition, an antenna is incorporated in the housing 1701. In addition to the above-described structure, a wireless IC chip, a small size memory device, or the like can be incorporated therein.

The display portion 1711 includes the semiconductor device disclosed in this specification. An image displayed (and the direction in which the image is displayed) in the display portion 1711 variously changes depending on the usage mode of the portable electronic device 1700. Moreover, since the display portion 1711 and the camera lens 1716 are provided on the same plane, voice call with images (so-called video calling) is possible. Note that the speaker 1712 and the microphone 1713 can be used not only for voice call but also for recording, reproducing, or the like. In the case where a still image and a moving image are shot by using the camera lens 1723 (and the light 1724), the display portion 1711 is used as a finder. The operation keys 1714 are used for operation of incoming and outgoing calls, simple information input for electronic mail or the like, scrolling of a screen, cursor motion, and the like.

The housings 1701 and 1702 overlapping with each other (FIG. 6A) can be slid to be developed as illustrated in FIG. 6C, so that the portable electronic device 1700 can be used as an information terminal. In this case, smooth operation with the keyboard 1721 and the pointing device 1715 can be performed. The external connection terminal 1717 can be connected to an AC adapter or a variety of cables such as a USB cable, whereby the portable electronic device 1700 can be charged or can perform data communication with a computer or the like. Moreover, by inserting a recording medium into the external memory slot 1722, a larger amount of data can be stored and moved. In addition to the above-described functions, a function of wireless communication by using electromagnetic waves such as infrared rays, a television receiver function, and the like can be included. By the semiconductor device disclosed in this specification, a portable electronic device with high reliability and high performance can be provided at low price.

As described above, the application range of the semiconductor device disclosed in this specification is extremely wide and the present invention can be used for electronic devices in a variety of fields. This embodiment can be used in combination with any of the other embodiments or example, as appropriate.

EXAMPLE 1

This example shows a state where a first substrate and a second substrate are separated from each other at an interface between a first single crystal semiconductor layer and a second single crystal semiconductor layer is shown. A sample was manufactured using a silicon layer as each of the first single crystal semiconductor layer and the second single crystal semiconductor layer. The second single crystal semiconductor layer was formed by a plasma CVD method under the following condition where the flow rate (sccm) ratio of silane and hydrogen was $SiH_4:H_2=25:150$ (sccm), the temperature of the substrate was 280° C., the output of a high-frequency power source was 30 W, and the power source frequency was 27 MHz.

Further, the first single crystal semiconductor layer is subjected to laser light irradiation treatment while being sprayed with nitrogen before the first substrate and the second substrate are attached to each other. The irradiation energy density of the laser light was 794 mJ/cm$^2$.

Figure 7:
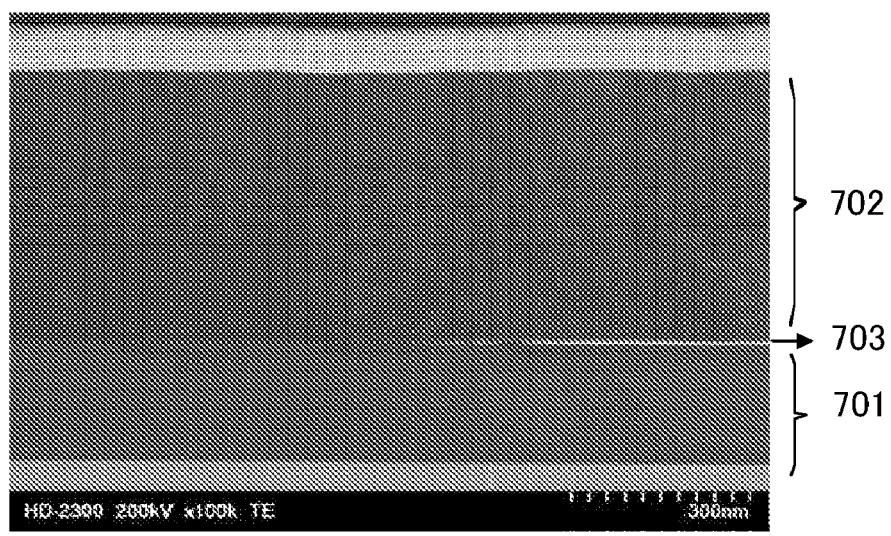
FIG. 7 is a TEM image showing a separation state.
Figure 8A:
FIGS. 8A to 8F illustrate an example of a method for manufacturing a semiconductor substrate.
Figure 8B:
Figure 8C:
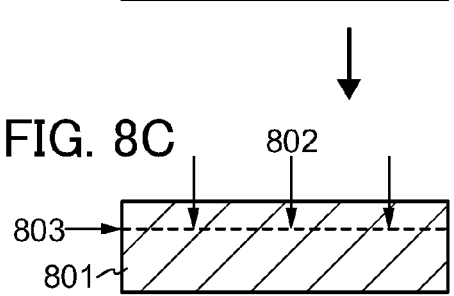
Figure 8D:
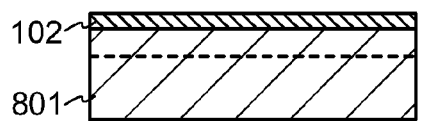
Figure 8E:
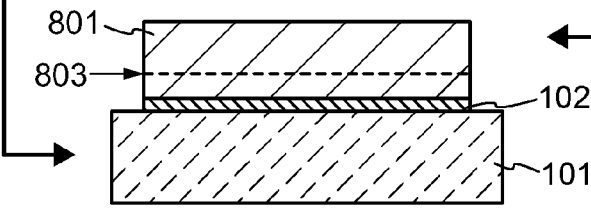
Figure 8F:
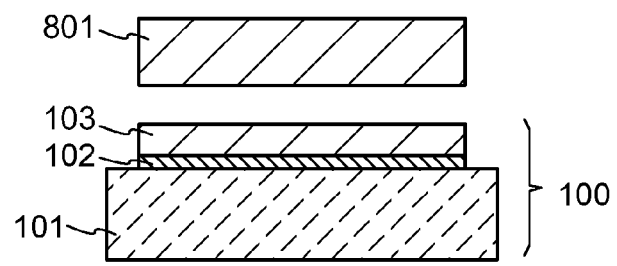

FIG. 7 is a cross-sectional view of a TEM image showing the separation state. It was confirmed that peeling at an interface 703 between a first single crystal semiconductor layer 701 and a second single crystal semiconductor layer 702 occurred and the separation was performed favorably.

The structure described in this example can be used in combination with any of the structures described in the embodiments of this specification, as appropriate.

This application is based on Japanese Patent Application serial No. 2008-302169 filed with Japan Patent Office on Nov. 27, 2008, the entire contents of which are hereby incorporated by reference.

What is claimed is:

1. A method for manufacturing a semiconductor substrate, comprising:
    providing a first single crystal semiconductor layer over a first substrate;
    removing a native oxide film from a surface of the first single crystal semiconductor layer before providing a second single crystal semiconductor layer;
    providing the second single crystal semiconductor layer over the first single crystal semiconductor layer by a vapor-phase epitaxial growth method;
    attaching the first substrate and a second substrate to each other with an insulating film interposed therebetween so that the first single crystal semiconductor layer and the second single crystal semiconductor layer are provided between the first substrate and the second substrate; and
    separating the first substrate and the second substrate from each other at an interface between the first single crystal semiconductor layer and the second single crystal semiconductor layer so that the first single crystal semiconductor layer is provided over the first substrate, and so that the second single crystal semiconductor layer is provided over the second substrate.

2. The method for manufacturing a semiconductor substrate, according to claim 1, wherein the second single crystal semiconductor layer is formed using a source gas containing a silane-based gas and hydrogen, and as for the source gas, a flow rate of hydrogen is greater than or equal to 4 times and less than or equal to 10 times that of a silane based gas.

3. The method for manufacturing a semiconductor substrate, according to claim 1, wherein the first substrate and the second substrate are glass substrates.

4. A method for manufacturing a semiconductor substrate, comprising:
    attaching a first substrate and a single crystal semiconductor substrate in which an embrittlement layer is formed at a predetermined depth, to each other with a first insulating film interposed between the first substrate and the single crystal semiconductor substrate;
    separating the single crystal semiconductor substrate and the first substrate from the embrittlement layer so that a first single crystal semiconductor layer is provided over the first substrate;
    removing a native oxide film from a surface of the first single crystal semiconductor layer before providing a second single crystal semiconductor layer;
    providing the second single crystal semiconductor layer over the first single crystal semiconductor layer by a vapor-phase epitaxial growth method;
    attaching the first substrate and a second substrate to each other with a second insulating film interposed therebetween so that the first single crystal semiconductor layer and the second single crystal semiconductor layer are provided between the first substrate and the second substrate; and
    separating the first substrate and the second substrate at an interface between the first single crystal semiconductor layer and the second single crystal semiconductor layer so that the first single crystal semiconductor layer is provided over the first substrate, and so that the second single crystal semiconductor layer is provided over the second substrate.

5. The method for manufacturing a semiconductor substrate, according to claim 4, wherein the second single crystal semiconductor layer is formed using a source gas containing a silane-based gas and hydrogen, and as for the source gas, a flow rate of hydrogen is greater than or equal to 4 times and less than or equal to 10 times that of a silane based gas.

6. The method for manufacturing a semiconductor substrate, according to claim 4, wherein the first substrate and the second substrate are glass substrates.

7. A method for manufacturing a semiconductor device, comprising:
    providing a single crystal semiconductor layer over a first substrate;
    providing a photoelectric conversion layer over the single crystal semiconductor layer by a vapor-phase epitaxial growth method;
    providing a first conductive layer over the photoelectric conversion layer;
    attaching the first substrate and a second substrate to each other with an insulating film interposed therebetween so that the single crystal semiconductor layer, the photoelectric conversion layer, and the first conductive layer are provided between the first substrate and the second substrate;
    separating the first substrate and the second substrate from each other at an interface between the single crystal semiconductor layer and the photoelectric conversion layer so that the single crystal semiconductor layer is provided over the first substrate, and so that the first conductive layer and the photoelectric conversion layer are provided over the second substrate; and
    providing a second conductive layer over the photoelectric conversion layer.

8. The method for manufacturing a semiconductor device, according to claim 7, wherein the first substrate and the second substrate are glass substrates.

9. A method for manufacturing a semiconductor device, comprising:
- providing a first single crystal semiconductor layer over a first substrate;
- providing a photoelectric conversion layer by forming a second single crystal semiconductor layer having one conductivity type, a third single crystal semiconductor layer which is intrinsic, and a fourth single crystal semiconductor layer having an opposite conductivity type to the one conductivity type in this order over the first single crystal semiconductor layer by a vapor-phase epitaxial growth method;
- providing a first conductive layer over the photoelectric conversion layer;
- attaching the first substrate and a second substrate to each other with an insulating film interposed therebetween so that the first single crystal semiconductor layer, the photoelectric conversion layer, and the first conductive layer are provided between the first substrate and the second substrate;
- separating the first substrate and the second substrate from each other at an interface between the first single crystal semiconductor layer and the second single crystal semiconductor layer so that the first single crystal semiconductor layer is provided over the first substrate, and so that the first conductive layer and the photoelectric conversion layer are provided over the second substrate; and
- providing a second conductive layer over the photoelectric conversion layer.

10. The method for manufacturing a semiconductor device, according to claim 9, wherein the second single crystal semiconductor layer is formed using a source gas containing a silane-based gas and hydrogen, and as for the source gas, a flow rate of hydrogen is greater than or equal to 4 times and less than or equal to 10 times that of a silane based gas.

11. The method for manufacturing a semiconductor device, according to claim 9, wherein the first substrate and the second substrate are glass substrates.

* * * * *